(12) United States Patent
Gronenborn

(10) Patent No.: US 9,929,537 B2
(45) Date of Patent: Mar. 27, 2018

(54) LASER DEVICE COMPRISING OPTICALLY PUMPED EXTENDED CAVITY LASER

(71) Applicant: KONINKLIJKE PHILIPS N.V., Eindhoven (NL)

(72) Inventor: Stephen Gronenborn, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/029,925

(22) PCT Filed: Oct. 21, 2014

(86) PCT No.: PCT/EP2014/072476
§ 371 (c)(1),
(2) Date: Apr. 15, 2016

(87) PCT Pub. No.: WO2015/062899
PCT Pub. Date: May 7, 2015

(65) Prior Publication Data
US 2016/0241000 A1   Aug. 18, 2016

(30) Foreign Application Priority Data

Oct. 30, 2013   (EP) .................................... 13190807

(51) Int. Cl.
*H01S 5/183*   (2006.01)
*H01S 5/04*   (2006.01)
(Continued)

(52) U.S. Cl.
CPC .......... *H01S 5/18361* (2013.01); *H01S 5/041* (2013.01); *H01S 5/0608* (2013.01);
(Continued)

(58) Field of Classification Search
CPC .... H01S 5/18361; H01S 5/1025; H01S 5/423; H01S 5/0608; H01S 5/041; H01S 5/141;
(Continued)

(56) References Cited

U.S. PATENT DOCUMENTS 5,627,853 A * 5/1997 Mooradian ............. H01S 5/041
372/18
5,745,153 A   4/1998 Kessler
(Continued)

FOREIGN PATENT DOCUMENTS

DE       3618607 A1    12/1987
JP    2006165292 A     12/2004
(Continued)

*Primary Examiner* — Xinning Niu

(57) ABSTRACT

The invention describes a laser device (100) enabling controlled emission of individual laser beams (194). The laser device (100) comprises an optically pumped extended cavity laser with one gain element whereby a multitude of pump lasers (110) are provided in order to generate independent pump beams (191) and thus corresponding laser beams (194). The laser device (100) may be used to enable simplified or improved laser systems (500) as, for example, two or three-dimensional laser printers. The pump laser (110) may be VCSEL and the laser (160) may be a VECSEL monolithically integrated with the pump VCSEL array on the same substrate. Pump mirrors (140) and external cavity mirror (150) may be integrated into a single optical reflector with regions having different curvature. The laser emission is controlled by the pump light, i.e. transversal shape of the laser beam and/or number of laser beams is controlled by switching on/off the individual pump lasers (110).

14 Claims, 6 Drawing Sheets

(51) Int. Cl.
*H01S 5/06* (2006.01)
*H01S 5/14* (2006.01)
*H01S 5/40* (2006.01)
*H01S 5/42* (2006.01)
*H01S 5/10* (2006.01)
*H01S 3/08* (2006.01)
*H01S 3/102* (2006.01)
*H01S 3/23* (2006.01)
*H01S 5/00* (2006.01)
*H01S 5/026* (2006.01)

(52) U.S. Cl.
CPC ............ *H01S 5/1025* (2013.01); *H01S 5/141* (2013.01); *H01S 5/4062* (2013.01); *H01S 5/423* (2013.01); *H01S 3/08068* (2013.01); *H01S 3/1022* (2013.01); *H01S 3/2383* (2013.01); *H01S 5/0071* (2013.01); *H01S 5/026* (2013.01)

(58) Field of Classification Search
CPC .... H01S 5/4062; H01S 3/1022; H01S 5/0071; H01S 3/2383; H01S 5/026; H01S 3/08068

See application file for complete search history.

(56) References Cited

U.S. PATENT DOCUMENTS

| | | | |
|---|---|---|---|
| 2010/0014547 A1* | 1/2010 | Cabaret | ............... H01S 3/09415 372/34 |
| 2012/0147912 A1* | 6/2012 | Moench | .................... H01S 5/14 372/29.02 |
| 2013/0253487 A1 | 9/2013 | Liu | |
| 2013/0255613 A1 | 10/2013 | Hartke | |

FOREIGN PATENT DOCUMENTS

| | | | | |
|---|---|---|---|---|
| JP | 2006165292 A | * | 6/2006 | ............. H01S 3/094 |
| WO | 2013160738 A1 | | 10/2013 | |
| WO | 2013160789 A1 | | 10/2013 | |

\* cited by examiner

LASER DEVICE COMPRISING OPTICALLY PUMPED EXTENDED CAVITY LASER

CROSS-REFERENCE TO PRIOR APPLICATIONS

This application is the U.S. National Phase application under 35 U.S.C. § 371 of International Application No. PCT/EP2014/072476, filed on Oct. 21, 2014, which claims the benefit of European Patent Application No. 13190807.1, filed on Oct. 30, 2013. These applications are hereby incorporated by reference herein.

FIELD OF THE INVENTION

The present invention relates to a laser device comprising an extended cavity laser. The extended cavity laser is preferably an optically pumped vertical external-cavity surface-emitting laser device comprising at least one vertical external-cavity surface-emitting laser (VECSEL) and several pump lasers, wherein said pump laser are arranged to optically pump an active region of the VECSEL by reflection of pump radiation at a mirror element. At least two of the pump lasers can be switched independently such that the shape and/or the extension of the emitted laser beam(s) can be influenced.

BACKGROUND OF THE INVENTION

Optically-pumped VECSELs or Semiconductor disc lasers (SDL) offer a compact and low-cost solution for medium laser powers with high brightness, narrow bandwidth and short laser pulses. Standard disc lasers need precise alignment of the pump lasers and the pump laser optic with respect to the optical mode of the laser resonator. Furthermore, applications of such optically-pumped VECSELs or SDL like computer-to-plate printing or selective laser melting usually require substantial effort in order to enable an acceptable workspace which can be processed by means of the emitted laser beams.

SUMMARY OF THE INVENTION

It's thus an object of the present invention to provide an improved laser device and an improved laser system comprising such laser devices.

According to a first aspect a laser device is provided. The laser device comprises at least two pump lasers. The pump lasers are preferably laser diodes like edge emitting laser diodes or Vertical Cavity Surfaces Emitting Laser (VCSEL) diodes. At least a first of the at least two pump lasers is adapted to emit a pump beam independently from at least a second pump laser of the at least two pump lasers. At least two of the pump lasers can be switched on and off independently from each other. Furthermore, the power of the pump beams may be controlled independently such that, for example, the first pump laser emits a pump beam of maximum power but the second pump laser emits an independent pump beam of 50% of the maximum power which can be emitted by the second pump laser. The laser device further comprises a gain element, a pump mirror and an extended cavity mirror for building an extended cavity laser together with the gain element. The pump mirror is arranged to redirect the pump beam of the first pump laser to a first pump spot on the gain element and the pump beam of the second pump laser to a second pump spot on the gain element, wherein the second pump spot at least partly comprises a different area on the gain element than the first pump spot. The laser device is preferably adapted to emit at least two independent laser beams. The reflectivity of the pump mirror is preferably as high as possible (e.g. >99.9%) in order to minimize losses and to avoid unnecessary heating of the pump mirror by means of the pump beams. The reflectivity of the extended cavity mirror is adapted such that lasing in combination with the gain element is enabled. The reflectivity further depends on whether the laser beam emitted by the laser device is emitted through the extended cavity mirror or not. The reflectivity of the extended cavity mirror is preferably in the range between 90% and 99.5% if the laser beam is emitted through the extended cavity mirror in order to enable laser emission. The reflectivity may also be lower than 90% depending on, for example, the reflectivity of mirror layers around the active layer in a semiconductor laser the so called inner cavity. The reflectivity is preferably higher than 99.9% if the laser beam is not emitted through the extended cavity mirror. The pump beams of the first and the second pump lasers are redirected by means of the pump mirror such that the pump spots do not overlap or at least one of the pump spots is not identical with other pump spot. The latter means that, for example, in the case of two pump spots the pump spots overlap but both pump spots comprise an area which is only pumped by means of one pump laser, or the first pump spot is comprised by the second pump spot but the second pump spot comprises an area which is not pumped by the first pump laser.

This principle can be generalized to three, four, five or a multitude of independent pump beams. Pump spot means in this respect that a defined volume of an active layer of the gain element is optically pumped by means of the respective pump beam emitted by the corresponding pump laser or pump lasers.

The first and the second pump spot preferably comprise different areas on the gain element such that the laser device is adapted to emit at least two laser beams, which laser beams do not overlap. Two, three, four or more independent laser beams emitted by the laser device can be used to extend the working space of the laser device. Conventional laser modules usually have to address a working space which is much bigger as the extension of the laser module. The laser module thus either has to be moved in order to address the working space or a scanner system has to be provided in order to redirect the laser beam to the intended working space. Moving the laser module or providing a scanner system increases the size of the total system. Providing independent laser beams which can be manipulated independently may thus decrease the demands regarding mechanical systems for moving the laser device or regarding scanner systems or even avoid such systems or scanners at all. Furthermore, the pitch between the independent laser beams emitted by the laser device may be smaller than 1 mm or even smaller than 100 µm depending on the size of the gain element. It may thus be possible to provide individually addressable parallel laser beams by means of the laser device with high resolution which may reduce the demands regarding mechanical support systems or scanners. In case of individually addressable but diverging laser beams it may be possible to irradiate a broad area of the working space without the need of mechanical support systems or scanners.

In an alternative approach the first pump spot overlaps with the second pump spot. Two, three, four or more independent laser beams emitted by the laser device can be used to adapt the shape and/or beam profile of the laser beam emitted by the laser device. A line of several pump spots may overlap such that the laser beam irradiates a line. Alternatively a first circular pump spot may be part of a second bigger circular pump spot such that beam profile of the laser beam may be influenced from e.g. Gaussian to top-hat or vice versa. In case of subsequent or alternating activation of pump beams with overlapping pump spots energy may be deposited by means of laser irradiation in a fine resolution. The absolute laser power of each laser beam may be adapted by means of the power of the respective pump beam and in addition the pulse duration of each pump beam may be used to provide overlapping irradiated areas such that the energy deposition per area and time can be adjusted in an exact way. The later may be advantageous for printing application like computer-to plate printing and 3-D printing (e.g. rapid prototyping).

A part of the pump lasers may be grouped together such that the grouped pump lasers are adapted to emit pump beams simultaneously. Two, three four or more pump lasers may by coupled such that the pump beams are emitted simultaneously. The pump spots may overlap. In this case, for example, a ring of overlapping pump spots may be used to emit a tube like laser beam. An independent laser beam may be arranged in the center of the tube like laser beam. Grouping of pump beams may also be used to increase pumping power by providing two, three or, for example, four times the power a single pump laser could provide. The same principle may be used in case of non-overlapping pump spots. Pump lasers and pump mirrors may, for example, be arranged such that a checkerboard pattern is provided wherein the "white" pump spots are grouped together and the "black" pump spots are grouped together. The "white" pump spots and the "black" pump spots can in this case be used to provide two independent sub-patterns of simultaneously emitted laser beams with a small pitch. The energy per area which may, for example, be provided in printing applications may thus be adaptable in an easy way.

The pump mirror and the extended cavity mirror are part of one first optical element. The pump mirror and the extended cavity mirror are mechanically coupled such that both are automatically adjusted with respect to each other. Pump lasers and gain element are arranged symmetrically around a first optical axis extending through the center of the gain element on a common heat sink with the gain element. The first optical element comprises a second optical axis extending to the center of the extended cavity mirror. Small tilt angles between the first and the second optical axis may cause no problems because the tilt angle is the same for the extended cavity mirror and the pump mirror. Furthermore, it's not possible that there is a lateral shift between the extended cavity mirror and the pump mirror because both are part of one first optical element.

The extended cavity mirror may comprise sub mirrors, wherein each sub mirror corresponds to one pump spot such that each sub mirror is adapted to focus a resonating beam to the respective pump spot. The sub mirrors may be parabolic or may be a part of a sphere. The curved sub mirrors may be used in this case to focus the resonating beams to the respective pump spots on the gain element in order to provide independent and preferably parallel laser beams with a small pitch between the pump spots.

The extended cavity mirror may be flat in alternative approach. The gain element may be arranged in this case in a way such that the pump spots correspond to thermal lenses such that resonating beams are focused to the flat extended cavity mirror. The thermal lenses may be used instead of curved sub mirrors to focus the resonating beams in order to provide independent and preferably parallel laser beams with a small pitch between the pump spots.

The first optical element may comprise an array of focusing lenses on the side of the first optical element facing the gain element and a flat extended cavity mirror on the side of the first optical element averted from the gain element. The resonating beams may in this case be focused by means of, for example, spherical protrusion at the side of the first optical element next to the gain element. The opposite side of the first optical may in this case be flat and mirrored such that the main parts of the resonating beams are reflected back through the protrusions to the respective pump spots on the gain element. The pump mirror may be provided on the same side as the protrusions, for example, arranged around the protrusions by means of an accordingly shaped mirrored surface. Alternatively, the pump mirror may be provided at the same side of the first optical element as the resonating mirror. The focusing lenses may also be used in addition to thermal lenses in the gain element.

The pump mirror may comprise sub pump mirrors being adapted to provide pump spots, which pump spots do not overlap. Cuttings of spheres may be provided for each pump laser such that each pump beam is focused to a separate pump spot on the gain element. The sub pump mirrors may also be used to provide overlapping pump spots. For example, ring like mirrors adjacent to each other may be provided, such that pump beams of pump lasers arranged on a circle around the gain element may in this case, for example, be focused on overlapping pump spots building a ring on the gain element. Alternatively or in addition beam manipulators may be provided, which beam manipulators are arranged between the pump lasers and the pump mirror. The beam manipulators are adapted to provide pump spots, which pump spots do not overlap. The beam manipulators may, for example, be prisms or an array of micro-lenses to redirect the pump beams. In most applications micro-lenses may be useful in order to increase the brilliance of the pump beams. The micro-lenses of the array may in this case be shifted with respect to the optical axis of the pump lasers given by the direction of emission of the beams. The resulting tilt angle of the pump beam may be chosen such that each pump beam is focused in combination with the pump mirror to a different pump spot.

The laser device may comprise a second optical element. The second optical element comprises the pump mirror and a beam diverter, wherein the beam diverter and the extended cavity mirror are adapted to spread the laser beams. The resonating beams may, for example, be parallel between the gain element and the beam spreader. The beam diverter may provide a surface tilted with respect to an optical axis of the gain element which is parallel to the pump beams between the gain element and the beam diverter. The beam diverter may, for example, be an extended lens, a surface comprising several ring shaped sub surfaces with different tilt angles or a surface for with sub surfaces with an individual tilt angle for each resonating beam. Furthermore, optical gratings may be used in order to divert the resonating beams. The extended cavity mirror is depending on the beam diverter arranged such that the resonating beams are reflected back to the corresponding pump spot. The beam diverter may be, for example, a lens with a first focus point and the extended cavity mirror comprises in this case a reflecting surface with a second focus point. The extended cavity mirror is arranged in a way that the first focus point coincides with the second focus point. The optical axis of the gain element coincides in this case preferably with the optical axis of the extended cavity mirror. This configuration may especially be suited for overlapping pump spots respectively resonating beams. In case of non-overlapping pump spots respectively resonating beams the extended cavity mirror may comprise a reflecting surface comprising a segment of a circle. The extended cavity mirror may in this case be arranged such that a middle point of the segment of the circle coincides with the first focus point. The lens may be a cylindrical lens such that the extended cavity mirror is also a part of a cylinder. The cylindrical lens does have a focus line parallel to the surface of the lens. The cutting of the cylinder with the extended cavity mirror also has a middle line and the middle line coincides with the focus line of the cylindrical lens. In an alternative approach a round (conventional) lens may be provided such that the extended cavity mirror is a cutting of a sphere wherein the middle point of the sphere coincides with the focus point of the round lens such that the resonating beams are reflected back to the corresponding pump spots.

The laser beams may preferably be emitted through the extended cavity mirror. The reflectivity of the extended cavity mirror has in this case to be adapted in a way that a part of the resonating beams passes the extended cavity mirror whereby the gain of extended cavity comprising the gain element and the extended cavity mirror passes the laser threshold such that lasing is enabled.

The pump lasers and the gain element are preferably processed on one substrate. The pump lasers may, for example, be Vertical Cavity Surface Emitting Lasers (VCSELs) which are processed together with the gain element on one substrate. The layer sequence and layer structure and the corresponding processing has in this case to be adapted to the wavelength of the pump beam to be emitted by the pump lasers and to the wavelength of the laser beam to be emitted by means of the gain element in combination with the extended cavity mirror. An antireflective coating may be locally provided on the side of the gain element facing the extended cavity mirror in order to reduce unwanted losses. Processing the pump lasers and the gain element on one substrate may have the advantage that no further alignment of the pump lasers and the gain element is needed. This perfect alignment may simplify the alignment of the pump mirror and the extended cavity mirror especially if both are provided within one optical element thus reducing the total effort and therefore the costs of the laser device.

According to a further aspect a laser system is provided. The laser system comprises a laser device as described above. The laser system may be a laser printing system. Laser printing means in this respect computer-to-plate printing or three dimensional printing (laser sintering) which may be used for rapid prototyping. Other applications are laser marking of plastic, metals etc. and thermo printing.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a first laser device

FIG. 2 shows a second laser device

FIG. 3 shows a principal sketch of a VCSEL pump laser

FIG. 4 shows a principal sketch of a gain element

FIG. 5 shows a third laser device

FIG. 6 shows a fourth laser device

FIG. 7 shows a first example of a gain element with different pump spots

FIG. 8 shows a second example of a gain element with different pump spots

FIG. 9 shows a third example of a gain element with different pump spots

FIG. 10 shows a principal sketch of a laser system comprising laser devices

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
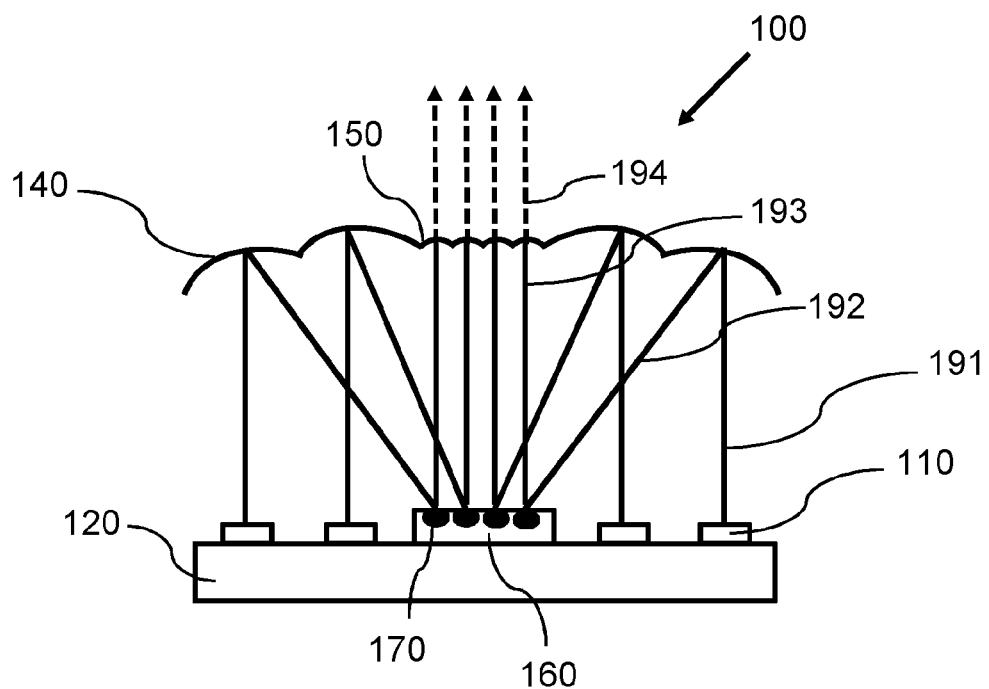

FIG. 1 shows a principal sketch of a cross section of a first laser device 100. The first laser device is preferably rotationally symmetric around the center axis (optical axis) of the gain element 160. Several pump lasers 110, preferably VCSEL arrays, are mounted on a common heat sink 120 together with at least one gain element 160, preferably a semiconductor disk laser element (also called OP-VECSEL). The pump lasers are adapted to emit pump beams 191 to a pump mirror 140 whereby each pump laser can be addressed individually. The pump mirror 140 comprises several areas with different shape and/or radius of curvature so called sub pump mirrors. The pump mirror 140 is placed in front of the module. The reflectivity of the pump mirror is as high as possible (e.g. >99.9%) in order to avoid losses. The pump mirror 140 focuses the reflected pump beams 192 onto the gain element 160, forming several pump spots 170. The sub pump mirrors of the pump mirror 140 are in the simplest form off-axis parabolic mirrors (or free-form mirrors to shape the reflected pump beam 192 to the desired shape). An extended cavity mirror 150 is positioned above the gain element 160. The extended cavity mirror 150 is positioned in the center of the pump mirror 140 and is thus surrounded by the pump mirror 140. The extended cavity mirror 150 and the pump mirror 140 are in this case separate mirrors which have to be adjusted with respect to each other. The latter may cause some adjustment effort such that one optical element comprising both the pump mirror 140 and the extended cavity mirror 150 may be advantageous. The extended cavity mirror 150 comprises sub mirrors each forming a stable cavity together with the gain element 160, resulting in several resonating beams 193 and finally laser beams 194 which are emitted through the extended cavity mirror 150. The extended cavity mirror 150 and consequently the sub mirrors have a reflectivity being sufficient to enable a stable extended laser cavity together with the gain element. The reflectivity is on the other hand not too high such that the laser beams 194 can pass the sub mirrors of the extended cavity mirror 150. The reflectivity may be, for example in the range between 90% and 99.5% but may be less depending on the gain element 160. The sub mirrors of the extended cavity mirror 150 can be simple spherical mirrors or also free-form mirrors. Each of the laser beams 194 can be individually addressed by means of addressing the pump lasers 110. The pitch of the laser beams 194 is determined by means of the pump mirror 140 and the extended cavity mirror 150 and can be as small as 100 μm. The laser device 100 thus enables a multitude of individually switchable laser beams 194 with a small pitch between the laser beams 194. Complicated mechanical or optical devices being adapted to move a laser module with high accuracy or to redirect a laser beam with high accuracy can be avoided or the accuracy can be reduced.

Figure 2:
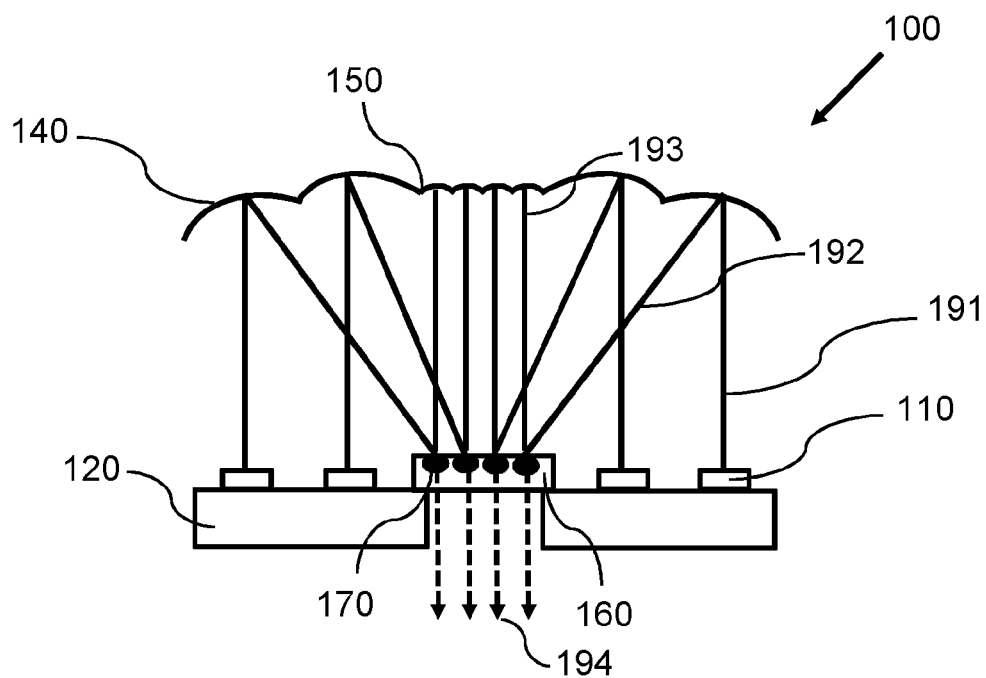

FIG. 2 shows a second laser device 100. The laser device 100 is nearly identical to the laser device shown in FIG. 1. There are only some minor differences. The pump mirror 140 and the extended cavity mirror 150 are one optical element in order to reduce adjustment effort. The reflectivity of the extended cavity mirror 150 is as high as possible (e.g. >99.9%) such that no laser beam 194 can pass the extended cavity mirror 150. The gain element 160 is arranged in a way that a stable extended laser cavity is built together with the extended cavity mirror 150 but the laser beams 194 can pass the gain element in the direction of the heat sink 120. The heat sink 120 thus has a hole underneath at least a part of the gain element such that the laser beams 194 can be emitted. The heat sink 120 may consist of a material with high heat conductivity as copper. The hole in the heat sink 120 underneath the gain element may be filled with a material transparent for the laser beams 194 but with an improved heat conductivity in comparison to air.

Figure 3:
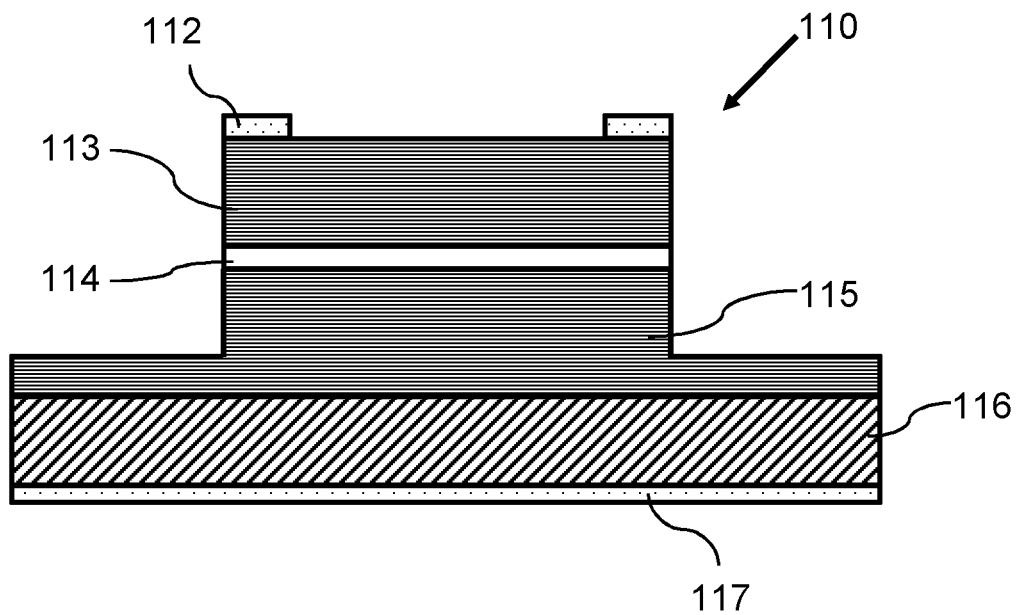

FIG. 3 shows a principal sketch of a VCSEL pump laser 110. The Figure shows a cross section of the VCSEL pump laser 110 showing the optical resonator. The optical resonator comprises a bottom DBR 115 and a top DBR 113 and an active layer 114 sandwiched in between the bottom DBR 115 and the top DBR 113. The bottom DBR 115 is highly reflective (>99%) and the top DBR 113 does have a somewhat smaller reflectivity (>95%) in order to enable emission of a pump beam 191 via the top DBR 113. The VCSEL is thus a so called top emitter. The active layer 114 comprises a number of layers building the Quantum Well structure. The bottom DBR 115 is arranged on a substrate like a GaAs-Substrate. The VCSEL is contacted by means of a bottom electrode 117 and a ring electrode 112. The bottom electrode 117 is provided on the side of the substrate opposite to the bottom DBR 115. The ring electrode 112 is provided on top of the top DBR 113. The VCSEL pump laser emits a pump beam 191 if sufficient electrical voltage and current is provided to the electrodes 112, 117. Variations of the arrangement of the layers without affecting the functionality of the layers are well known to those skilled in the art. A VCSEL pump laser 110 may, for example, also be configured as a so called bottom emitter emitting the pump beam 191 through the bottom DBR and the in this case transparent substrate. The reflectivity of the DBRs and the arrangement of the electrodes have to be adapted accordingly.

Figure 4:
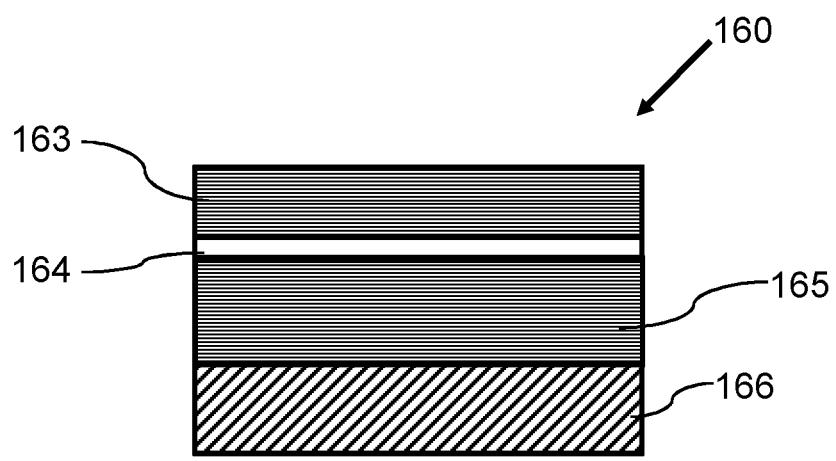

FIG. 4 shows a principal sketch of a cross section of a gain element 160. The gain element comprises a bottom DBR 165 and optionally a top DBR 163 and an active layer 164 sandwiched in between the bottom DBR 165 and the top DBR 163. The bottom DBR 165 is highly reflective (>99%) and the top DBR 163 does have a small reflectivity of, for example, 50% such that no lasing is possible without additional technical measures. The top DBR 163 may even be removed and only an anti-reflective coating may be provided. Therefore, additional optical feedback by means of the extended cavity mirror 150 is needed in order to enable lasing if the gain element is optically pumped by means of pump lasers 110. Comparing the structure of the VCSEL pump laser 110 shown in FIG. 3 and the gain element 160 shown in FIG. 4 it's obvious that both can be manufactured on one substrate. Substrate 116 and 166 would be the same in this case and the gain element 160 may comprise in this case an unused bottom electrode 117 or the bottom electrode 117 may be removed underneath the gain element 160. The layer sequence and layer structure of the top and bottom DBRs and the quantum well layers of the active layers has in this case to be adapted to the wavelength of the pump beam 191 to be emitted by the pump lasers 110 and to the wavelength of the laser beam 194 to be emitted by means of the gain element 160 in combination with the extended cavity mirror 150. This may cause some additional processing steps. Processing of pump lasers 110 and gain element 160 on one substrate may reduce the effort of assembling the laser device. Furthermore, the gain element 160 may be arranged in a way that laser emission through the bottom DBR 163 is possible. The bottom DBR 163 may in this case be manufactured in way that the reflectivity is around 95%.

Figure 5:
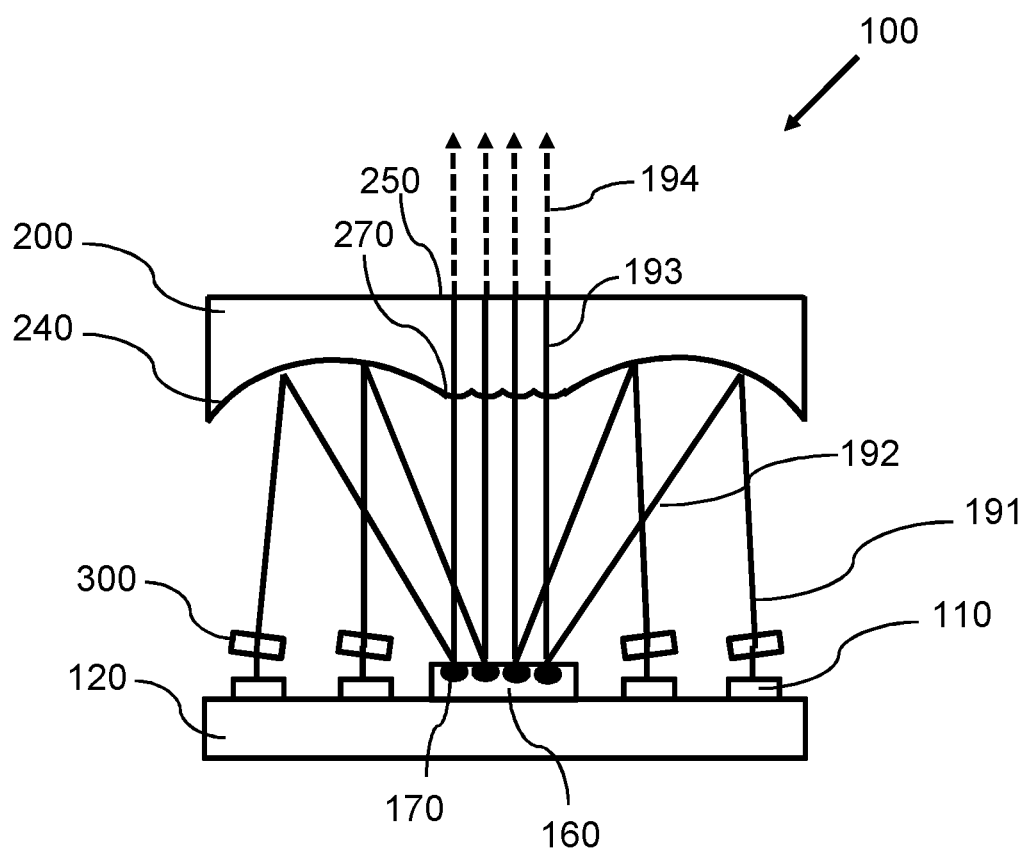

FIG. 5 shows a principal sketch of a cross section of a third laser device 100. The individual pump spots are realized by a pump mirror 240 being a common parabolic mirror, but with the pump beams 191 of the pump lasers 110 having different incident angles onto the pump mirror 240, thus resulting in separated pump spots 170. The difference in the incidence angle can be e.g. realized by using beam manipulators 300 like micro lens arrays to collimate the pump beam 191 of the pump lasers 110. The micro lens arrays of the pump lasers 110 are slightly misaligned in the direction parallel to the plane of the array, resulting in a tilt of the pump beams 191 and the reflected pump beams 192, which leads to a lateral shift of the pump spots 170 on the gain element 160. The extended laser cavity for the individual resonating beams 193 and the finally emitted laser beams 194 are formed by the extended cavity mirror 250 which is a common flat mirror and, for example, the bottom DBR 165 of the gain element 160. Furthermore, a focusing lens 270 is provided in form of a lens array with one lens per pump spot 170 to focus the resonating beams 193 to the respective pump spot 170. The extended cavity mirror 250, the pump mirror 240 and the focusing lens 270 are comprised by one first optical element 200. The optical element is made of glass with low absorption in the frequency range of the resonating beams 193. The pump mirror 240 and the focusing lens 270 are provided on the side adjacent to the pump lasers 110 and the gain element. And the extended cavity mirror 250 is provided on the opposite side of the first optical element 200. The pump mirror 240 and the extended cavity mirror may be manufactured by coating the respective areas of the first optical element. The focusing lens 270 may be an array of spherical protrusions which may be processed by pressing or grinding.

Figure 6:
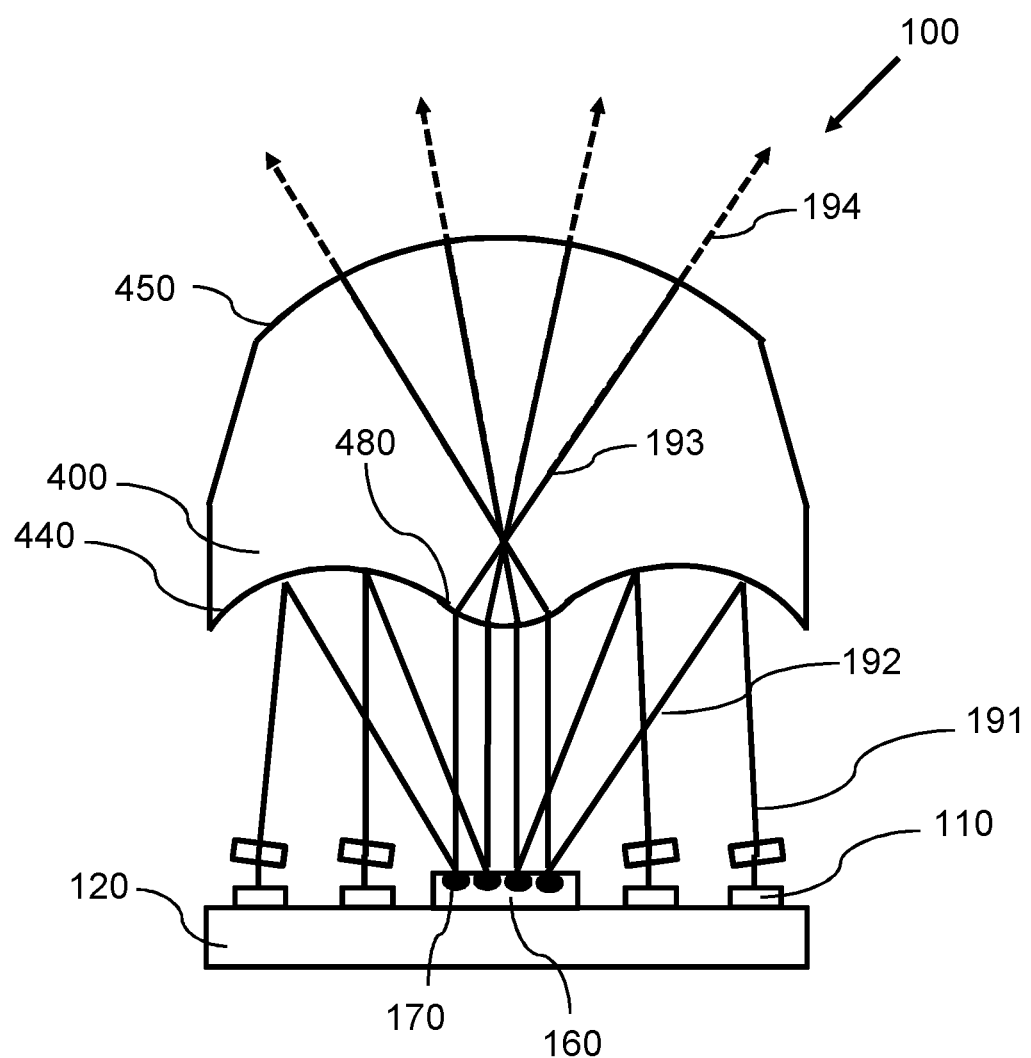

FIG. 6 shows a principal sketch of a cross section of a fourth laser device 100. The configuration is similar to the configuration described with respect to FIG. 5 but the first optical element 200 is replaced by a second optical element 400. The pump mirror 440 is configured in the same way as the pump mirror 240 of FIG. 5 but the lens array of the focusing lens 270 was replaced by a beam diverter 480 which consists of one common lens. Thermal lenses formed in the gain element 160 focus the resonating beams 193 such that the resonating beams 193 hit the lens surface (beam diverter 480) at different points such that resonating beams 193 are diffracted differently and are focused in the focus point of the lens which is at the same time the middle point of the extended cavity mirror 450 which is a spherical mirror replacing the flat mirror of FIG. 5. The resonating beams 193 are thus reflected back to the corresponding pump spots 170. Thus, the images of all pump spots 170 are imaged onto themselves after one cavity roundtrip and are not coupled to a common resonator mode, resulting in the individual laser beams 194 which leave the extended cavity resonator under different angles. It's therefore possible to irradiate a line or an area depending on the arrangement of the pump lasers 110, pump mirror 440 and the shape of the gain element 160 which are much bigger than the size of the gain element 160. The effort with respect to mechanical or optical support devices (e.g. scanner) may thus be reduced. The second optical element 400 comprises in this embodiment the pump mirror 440, the beam diverter 480 and the extended cavity mirror 450. In an alternative approach separate devices (e.g. separate spherical mirror) may be used in order to provide the same functionality.

Figure 7:
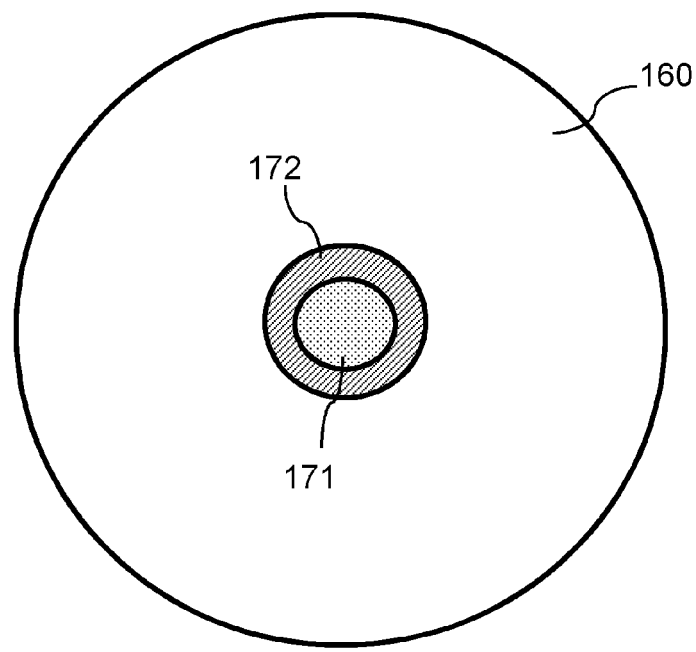

FIG. 7 shows a first example of a gain element 160 with different pump spots 171, 172. The first pump spot 171 is round and comprised by the second round pump spot 172 which has a bigger diameter as the first pump spot 171. The beam shape of the laser beam 194 may thus be influenced by means of switching the pump laser(s) 110 of the first pump spot 171 independently from the pump laser(s) of the second pump spot 172.

Figure 8:
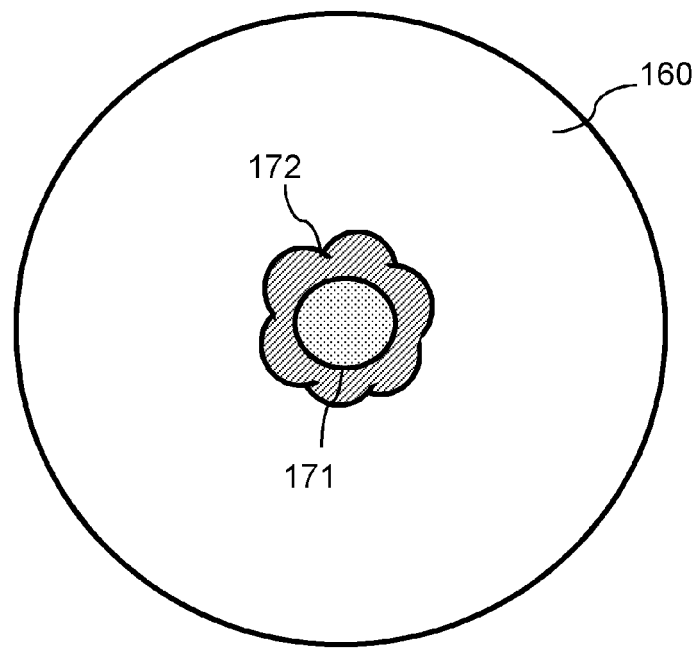

FIG. 8 shows a second example of a gain element 160 with different pump spots 171, 172. The first pump spot 171 is again round as shown in FIG. 7. The second pump spot 172 is built by means of overlapping pump spots of six pump lasers 110 each providing a round pump spot. The six pump lasers 110 are grouped together such that the pump beams 191 are emitted simultaneously. The second pump spot 172 comprises an area in the middle which is not pumped if the pump laser(s) 110 corresponding to the first pump spot 171 is or are switched off.

Figure 9:
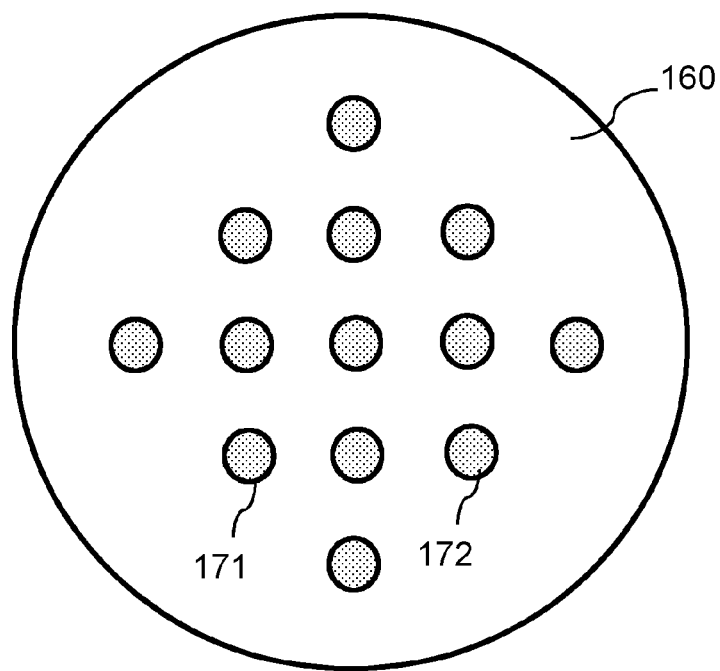

FIG. 9 shows a third example of a gain element 160 with different pump spots 171, 172. The pump spots 171, 172 are arranged in a regular array with a pitch of 100 μm. Each pump spot 171, 172 corresponds to one pump laser 110 which can be individually switched. The irradiated energy per area may thus be adapted by switching the pump lasers.

Figure 10:
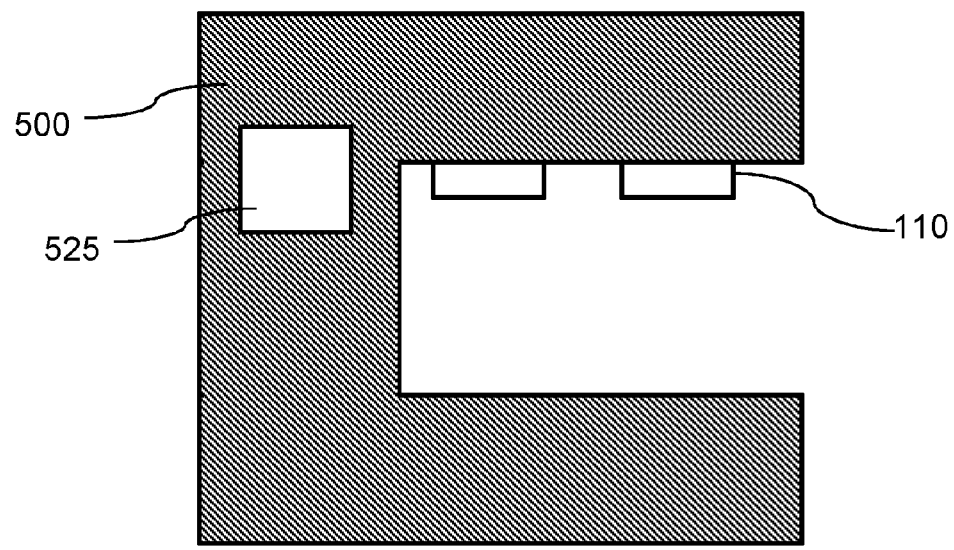

FIG. 10 shows a principal sketch of a cross section of a laser system 500 comprising laser devices 110. The laser system 500 is a laser printing system comprising several laser devices 100 of the type described with respect to FIG. 6 and a laser controller 525. The individual pump lasers 110 of each laser device 100 can be controlled by means of the laser controller such that the whole printing area can be irradiated without any mechanical or optical scanner system. The size of the laser printing system can be reduced and the reliability can be increased because no moving mechanical parts are needed.

A laser device is described enabling controlled emission of individual laser beams. The laser device comprises an optically pumped extended cavity laser with one gain element whereby a multitude of pump lasers are provided in order to generate independent pump beams and thus corresponding laser beams. The individual laser beams may be used to influence the beam shape and/or to provide a multitude of individual parallel laser beams with a small pitch. The laser device may be used to enable simplified laser systems as two or three-dimensional laser printers.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 100 laser device
110 pump laser
112 ring electrode
113, 163 top DBR
114, 164 active layer
115, 165 bottom DBR
116, 166 substrate
117 bottom electrode
120 heat sink
140, 240, 440 pump mirror
150, 250, 450 extended cavity mirror
160 gain element
170 pump spot
171 first pump spot
172 second pump spot
191 emitted pump beam
192 reflected pump beam
193 resonating beam
194 laser beam
200 first optical element
270 focusing lens
300 beam manipulator
400 second optical element
480 beam diverter
500 laser system
525 laser controller

The invention claimed is:

1. A laser device comprising at least two pump lasers, wherein at least a first of the at least two pump lasers is adapted to emit a pump beam independently from at least a second pump laser of the at least two pump lasers, the laser device further comprising a gain element, the laser device comprising a first optical element, wherein the first optical element comprises a pump mirror and an extended cavity mirror, wherein the extended cavity mirror is arranged for building an extended cavity laser with the gain element, and wherein the extended cavity mirror comprises sub mirrors, wherein each sub mirror corresponds to one pump spot such that each sub mirror is adapted to focus a resonating beam to the respective pump spot, wherein the pump mirror is arranged to redirect the pump beam of the first pump laser to a first pump spot on the gain element and the pump beam of the second pump laser to a second pump spot on the gain element, wherein the second pump spot comprises a different area on the gain element than the first pump spot, wherein the gain element has a first optical axis extending through the center of the gain element and the pump lasers being arranged symmetrically around the first optical axis on a common heat sink with the gain element, wherein the first optical element comprises a second optical axis extending to the center of the extended cavity mirror, wherein the first optical axis is independent from the second optical axis in a way that small tilt angles or lateral shifts between the first optical axis and the second optical axis do not inhibit lasing.

2. The laser device according to claim 1, wherein the first and the second pump spot comprise different areas on the gain element such that the laser device is adapted to emit at least two laser beams, which laser beams do not overlap.

3. The laser device according to claim 1, wherein the first pump spot overlaps with the second pump spot.

4. The laser device according to claim 1, wherein a part of the pump lasers are grouped together such that the grouped pump lasers are adapted to emit pump beams simultaneously.

5. The laser device according to claim 1, wherein the extended cavity mirror is flat and the gain element is arranged in a way that the pump spots correspond to thermal lenses such that resonating beams are focused to the flat extended cavity mirror.

6. The laser device according to claim 1, wherein the first optical element comprises an array of focusing lenses on the side of the first optical element facing the gain element and a flat extended cavity mirror on the side of the first optical element averted from the gain element.

7. The laser device according to claim 2, wherein the pump mirror comprises sub pump mirrors being adapted to provide pump spots, which pump spots do not overlap.

8. The laser device according to claim 2 comprising beam manipulators being arranged between the pump lasers and the pump mirror, and the beam manipulators are adapted to provide pump spots, which pump spots do not overlap.

9. The laser device according to claim 1, the laser device comprising a second optical element, wherein the second optical element comprises the first optical element and a beam diverter, wherein the beam diverter and the extended cavity mirror are adapted to spread the laser beams.

10. The laser device according to claim 9, wherein the beam diverter is a lens with a first focus point and the extended cavity mirror comprises a reflecting surface with a second focus point, and the extended cavity mirror is arranged in a way that the first focus point coincides with the second focus point.

11. The laser device according to claim 9, wherein the beam diverter is a lens with a first focus point and the extended cavity mirror comprises a reflecting surface comprising a segment of a circle, wherein the extended cavity mirror is arranged such that a middle point of the segment of the circle coincides with the first focus point.

12. The laser device according to claim 1, wherein the laser beam is emitted through the extended cavity mirror.

13. A laser system comprising a laser device according to claim 1.

14. The laser device according to claim 1, wherein the first pump laser, or the second pump laser, or both are vertical cavity surface emitting lasers (VCSELs).

* * * * *